(12) United States Patent
Pahl

(10) Patent No.: US 8,229,139 B2
(45) Date of Patent: Jul. 24, 2012

(54) MEMS MICROPHONE, PRODUCTION METHOD AND METHOD FOR INSTALLING

(75) Inventor: Wolfgang Pahl, Munich (DE)

(73) Assignee: EPCOS AG, Munich (DE)

( * ) Notice: Subject to any disclaimer, the term of this patent is extended or adjusted under 35 U.S.C. 154(b) by 858 days.

(21) Appl. No.: 12/092,423

(22) PCT Filed: Nov. 6, 2006

(86) PCT No.: PCT/DE2006/001946
§ 371 (c)(1),
(2), (4) Date: May 2, 2008

(87) PCT Pub. No.: WO2007/054071
PCT Pub. Date: May 18, 2007

(65) Prior Publication Data
US 2008/0279407 A1    Nov. 13, 2008

(30) Foreign Application Priority Data
Nov. 10, 2005  (DE) .......................... 10 2005 053 767

(51) Int. Cl.
*H04R 25/00* (2006.01)
*H04R 9/08* (2006.01)
*H03B 29/00* (2006.01)

(52) U.S. Cl. ....... 381/150; 381/71.7; 381/122; 381/162; 381/355

(58) Field of Classification Search ................. 381/71.7, 381/122, 150, 162, 355
See application file for complete search history.

(56) References Cited

U.S. PATENT DOCUMENTS

| 2,105,010 | A | 1/1938 | Sawyer |
| 3,447,217 | A | 6/1969 | Kumada |
| 3,587,322 | A | 6/1971 | Lobdell et al. ................. 73/420 |
| 3,726,002 | A | 4/1973 | Greenstein et al. |
| 3,735,211 | A | 5/1973 | Kapnias |
| 3,980,917 | A | 9/1976 | Kakizaki et al. |
| 4,127,840 | A | 11/1978 | House |
| 4,222,277 | A | 9/1980 | Kurtz |
| 4,277,814 | A | 7/1981 | Giachino et al. |
| 4,314,226 | A | 2/1982 | Oguro et al. |
| 4,424,419 | A | 1/1984 | Chaput et al. ............. 179/111 E |
| 4,454,440 | A | 6/1984 | Cullen |

(Continued)

FOREIGN PATENT DOCUMENTS

CA    2315417    2/2001

(Continued)

OTHER PUBLICATIONS

International Preliminary Report on Patentability in Application No. PCT/EP05/004309, dated Nov. 29, 2006.

(Continued)

*Primary Examiner* — Long Tran
(74) *Attorney, Agent, or Firm* — Fish & Richardson P.C.

(57) ABSTRACT

A microphone in a miniaturized form is described herein. The microphone includes a flat carrier substrate having a first recess extending through the carrier substrate. The microphone includes a first electro-acoustic transducer on a first surface of the carrier substrate and at least partially overlapping the first recess. The microphone also includes a cap on a second surface opposite the first surface having a tight seal with the second surface and spanning the first recess. The cap includes at least one metallic layer for electromagnetic shielding.

12 Claims, 3 Drawing Sheets

U.S. PATENT DOCUMENTS

| | | | |
|---|---|---|---|
| 4,456,796 A | 6/1984 | Nakagawa et al. | |
| 4,504,703 A | 3/1985 | Schneiter et al. | |
| 4,533,795 A | 8/1985 | Baumhauer | |
| 4,545,440 A | 10/1985 | Treadway | 173/132 |
| 4,558,184 A | 12/1985 | Busch-Vishniac et al. | |
| 4,628,740 A | 12/1986 | Ueda et al. | |
| 4,641,054 A | 2/1987 | Takahata et al. | |
| 4,691,363 A | 9/1987 | Khanna | |
| 4,737,742 A | 4/1988 | Takoshima et al. | |
| 4,776,019 A | 10/1988 | Miyatake | |
| 4,816,125 A | 3/1989 | Muller et al. | |
| 4,817,168 A | 3/1989 | Fidi | |
| 4,825,335 A | 4/1989 | Wilner | |
| 4,866,683 A | 9/1989 | Phillips | 367/157 |
| 4,908,805 A | 3/1990 | Sprenkels et al. | |
| 4,910,840 A | 3/1990 | Sprenkels et al. | |
| 4,984,268 A | 1/1991 | Brown et al. | |
| 5,059,848 A | 10/1991 | Mariani | |
| 5,091,051 A | 2/1992 | Greer | |
| 5,101,543 A | 4/1992 | Cote et al. | |
| 5,146,435 A | 9/1992 | Bernstein | |
| 5,151,763 A | 9/1992 | Marek et al. | |
| 5,153,379 A | 10/1992 | Guzuk et al. | |
| 5,179,015 A | 1/1993 | Loeppert et al. | |
| 5,184,107 A | 2/1993 | Maurer | 338/42 |
| 5,216,490 A | 6/1993 | Greiff et al. | 73/517 R |
| 5,257,547 A | 11/1993 | Boyer | |
| 5,357,807 A | 10/1994 | Guckel et al. | |
| 5,394,011 A | 2/1995 | Yamamoto et al. | |
| 5,408,731 A | 4/1995 | Berggvist et al. | |
| 5,449,909 A | 9/1995 | Kaiser et al. | |
| 5,452,268 A | 9/1995 | Bernstein | |
| 5,459,368 A | 10/1995 | Onishi et al. | |
| 5,465,008 A | 11/1995 | Goetz et al. | |
| 5,477,008 A | 12/1995 | Pasqualoni et al. | |
| 5,490,220 A | 2/1996 | Loeppert | |
| 5,506,919 A | 4/1996 | Roberts | |
| 5,531,787 A | 7/1996 | Lesinski et al. | |
| 5,545,912 A | 8/1996 | Ristic et al. | |
| 5,573,435 A | 11/1996 | Grabbe et al. | |
| 5,592,391 A | 1/1997 | Muyshondt et al. | |
| 5,593,926 A | 1/1997 | Fujihira | |
| 5,650,685 A | 7/1997 | Kosinski et al. | 310/316 |
| 5,659,195 A | 8/1997 | Kaiser et al. | |
| 5,712,523 A | 1/1998 | Nakashima et al. | |
| 5,739,585 A | 4/1998 | Akram et al. | 257/698 |
| 5,740,261 A | 4/1998 | Loeppert et al. | |
| 5,748,758 A | 5/1998 | Menasco, Jr. et al. | |
| 5,821,665 A | 10/1998 | Onishi et al. | |
| 5,831,262 A | 11/1998 | Greywall et al. | |
| 5,838,551 A | 11/1998 | Chan | |
| 5,852,320 A | 12/1998 | Ichihashi | |
| 5,870,482 A | 2/1999 | Loeppert et al. | |
| 5,872,397 A | 2/1999 | Diffenderfer et al. | |
| 5,886,876 A | 3/1999 | Yamaguchi | |
| 5,889,872 A | 3/1999 | Sooriakumar et al. | |
| 5,901,046 A | 5/1999 | Ohta et al. | |
| 5,923,995 A | 7/1999 | Kao et al. | |
| 5,939,968 A | 8/1999 | Nguyen et al. | |
| 5,990,418 A | 11/1999 | Bivona et al. | 174/52.4 |
| 5,999,821 A | 12/1999 | Kaschke | |
| 6,012,335 A | 1/2000 | Bashir et al. | |
| 6,052,464 A | 4/2000 | Harris | |
| 6,057,222 A | 5/2000 | Pahl et al. | |
| 6,075,867 A | 6/2000 | Bay et al. | |
| 6,078,245 A | 6/2000 | Fritz et al. | |
| 6,108,184 A | 8/2000 | Minervini et al. | |
| 6,118,881 A | 9/2000 | Quinlan et al. | |
| 6,136,175 A | 10/2000 | Stelzl et al. | |
| 6,136,419 A | 10/2000 | Fasano et al. | |
| 6,150,753 A | 11/2000 | DeCastro | 310/334 |
| 6,157,546 A | 12/2000 | Petty et al. | |
| 6,163,071 A | 12/2000 | Yamamura | |
| 6,178,249 B1 | 1/2001 | Hietanen et al. | |
| 6,182,342 B1 | 2/2001 | Sawin | |
| 6,187,249 B1 | 2/2001 | Lewellin | 264/463 |
| 6,191,928 B1 | 2/2001 | Rector et al. | |
| 6,242,842 B1 | 6/2001 | Pahl et al. | |
| 6,282,072 B1 | 8/2001 | Minervini et al. | |
| 6,310,420 B1 | 10/2001 | Pahl et al. | |
| 6,324,907 B1 | 12/2001 | Halteren et al. | 73/431 |
| 6,398,943 B1 | 6/2002 | Arens-Fischer et al. | |
| 6,400,065 B1 | 6/2002 | Toda et al. | 310/334 |
| 6,413,408 B1 | 7/2002 | Berger et al. | |
| 6,433,412 B2 | 8/2002 | Ando et al. | 257/678 |
| 6,437,449 B1 | 8/2002 | Foster | |
| 6,439,869 B1 | 8/2002 | Seng et al. | |
| 6,449,828 B2 | 9/2002 | Pahl et al. | |
| 6,492,194 B1 | 12/2002 | Bureau et al. | 438/106 |
| 6,519,822 B1 | 2/2003 | Stelzl et al. | |
| 6,522,762 B1 | 2/2003 | Mullenborn | |
| 6,528,924 B1 | 3/2003 | Stelzl et al. | |
| 6,530,515 B1 | 3/2003 | Glenn et al. | |
| 6,555,758 B1 | 4/2003 | Stelzl et al. | |
| 6,566,672 B1 | 5/2003 | Schlough et al. | |
| 6,594,369 B1 | 7/2003 | Une | |
| 6,613,605 B2 | 9/2003 | Pace | |
| 6,614,911 B1 | 9/2003 | Watson et al. | |
| 6,621,392 B1 | 9/2003 | Volant et al. | |
| 6,625,031 B2 | 9/2003 | Sano et al. | |
| 6,649,446 B1 | 11/2003 | Goetz et al. | |
| 6,674,159 B1 | 1/2004 | Peterson et al. | |
| 6,685,168 B1 | 2/2004 | Stelzl et al. | |
| 6,710,840 B2 | 3/2004 | Umemoto et al. | |
| 6,722,030 B1 | 4/2004 | Stelzl et al. | |
| 6,732,588 B1 | 5/2004 | Mullenborn et al. | 72/715 |
| 6,781,231 B2 | 8/2004 | Minervini | 257/704 |
| 6,800,987 B2 | 10/2004 | Toda | 310/348 |
| 6,809,413 B1 | 10/2004 | Peterson et al. | 257/680 |
| 6,829,131 B1 | 12/2004 | Loeb et al. | 361/234 |
| 6,838,739 B2 | 1/2005 | Stelzl et al. | |
| 6,904,155 B2 | 6/2005 | Yonehara et al. | 381/174 |
| 6,909,183 B2 | 6/2005 | Feiertag et al. | |
| 6,924,429 B2 | 8/2005 | Kasai et al. | 174/52.3 |
| 6,924,974 B2 | 8/2005 | Stark | |
| 6,930,364 B2 | 8/2005 | Bruner | 257/414 |
| 6,982,380 B2 | 1/2006 | Hoffmann et al. | |
| 7,003,127 B1 | 2/2006 | Sjursen | |
| 7,053,456 B2 | 5/2006 | Matsuo | |
| 7,072,482 B2 | 7/2006 | Van Doorn et al. | 381/355 |
| 7,080,442 B2 | 7/2006 | Kawamura et al. | |
| 7,092,539 B2 | 8/2006 | Sheplak et al. | 381/114 |
| 7,094,626 B2 | 8/2006 | Stelzl et al. | |
| 7,146,016 B2 | 12/2006 | Pedersen | |
| 7,166,910 B2 | 1/2007 | Minervini | 257/704 |
| 7,242,089 B2 | 7/2007 | Minervini | 257/704 |
| 7,259,041 B2 | 8/2007 | Stelzl et al. | 438/106 |
| 7,298,856 B2 | 11/2007 | Tajima et al. | |
| 7,388,281 B2 | 6/2008 | Krueger et al. | |
| 7,434,305 B2 | 10/2008 | Minervini | |
| 7,439,616 B2 | 10/2008 | Minervini | |
| 7,492,019 B2 | 2/2009 | Carley | |
| 7,518,201 B2 | 4/2009 | Stelzl et al. | |
| 7,518,249 B2 | 4/2009 | Krueger et al. | |
| 7,537,964 B2 | 5/2009 | Minervini | |
| 7,544,540 B2 | 6/2009 | Bauer et al. | |
| 7,608,789 B2 | 10/2009 | Krueger et al. | |
| 7,692,288 B2 | 4/2010 | Zhe | |
| 7,903,831 B2 | 3/2011 | Song | |
| 8,018,049 B2 | 9/2011 | Minervini | |
| 2001/0010444 A1 | 8/2001 | Pahl et al. | |
| 2002/0067663 A1 | 6/2002 | Loeppert et al. | |
| 2002/0074239 A1 | 6/2002 | Berger et al. | |
| 2002/0076910 A1 | 6/2002 | Pace | |
| 2002/0102004 A1 | 8/2002 | Minervini | |
| 2002/0110256 A1 | 8/2002 | Watson et al. | 381/389 |
| 2003/0010530 A1 | 1/2003 | Scheel et al. | |
| 2003/0034536 A1 | 2/2003 | Scheeper et al. | 257/419 |
| 2003/0035558 A1 | 2/2003 | Kawamura et al. | 381/113 |
| 2003/0047806 A1 | 3/2003 | Stelzl et al. | |
| 2003/0124829 A1 | 7/2003 | Pace | |
| 2003/0133588 A1 | 7/2003 | Pedersen | |
| 2003/0151133 A1 | 8/2003 | Kinayman et al. | |
| 2003/0153116 A1 | 8/2003 | Carley et al. | |
| 2004/0032705 A1 | 2/2004 | Ma | |
| 2004/0046245 A1 | 3/2004 | Minervini | 257/704 |
| 2004/0058473 A1 | 3/2004 | Feiertag et al. | |

| | | | | | | |
|---|---|---|---|---|---|---|
| 2004/0064941 A1 | 4/2004 | Dozier, II et al. | | WO | WO 99/43084 | 8/1999 |
| 2004/0118595 A1 | 6/2004 | Flammer et al. | | WO | WO 99/56390 | 11/1999 |
| 2004/0150939 A1 | 8/2004 | Huff | | WO | 00/42636 | 7/2000 |
| 2004/0161530 A1 | 8/2004 | Stark | | WO | WO 00/70630 | 11/2000 |
| 2004/0231872 A1 | 11/2004 | Arnold et al. | | WO | 01/19134 | 3/2001 |
| 2004/0237299 A1 | 12/2004 | Stelzl et al. | | WO | 01/20948 | 3/2001 |
| 2004/0239449 A1 | 12/2004 | Stelzl et al. | | WO | WO 01/26136 | 4/2001 |
| 2005/0018864 A1 | 1/2005 | Minrvini ............... 381/175 | | WO | 02/41497 | 6/2001 |
| 2005/0034888 A1 | 2/2005 | Hoffmann et al. | | WO | 02/15636 | 2/2002 |
| 2005/0069164 A1 | 3/2005 | Muthuswamy et al. | | WO | WO02/15636 | 2/2002 |
| 2005/0121785 A1 | 6/2005 | Stelzl et al. | | WO | WO 02/17364 | 2/2002 |
| 2005/0185812 A1 | 8/2005 | Minervini | | WO | 02/45463 | 6/2002 |
| 2005/0218488 A1 | 10/2005 | Matsuo ............... 257/678 | | WO | 03/017364 | 2/2003 |
| 2005/0242420 A1 | 11/2005 | Matsuda et al. | | WO | WO2004/019490 | 3/2004 |
| 2006/0151203 A1 | 7/2006 | Krueger et al. | | WO | 2005/036698 | 5/2004 |
| 2006/0157841 A1 | 7/2006 | Minervini ............... 257/680 | | WO | WO2004/051745 | 6/2004 |
| 2006/0249802 A1 | 11/2006 | Stelzl et al. | | WO | WO 2005/086532 | 9/2005 |
| 2007/0069354 A1 | 3/2007 | Dangelmaier et al. | | WO | WO2005/086534 | 9/2005 |
| 2007/0082421 A1 | 4/2007 | Minervini ............... 438/50 | | WO | WO2005/086535 | 9/2005 |
| 2007/0099327 A1 | 5/2007 | Hartzell et al. ............... 438/51 | | WO | WO2005/102910 | 11/2005 |
| 2007/0127982 A1 | 6/2007 | Bohlen et al. | | WO | WO2006/089638 | 8/2006 |
| 2007/0189558 A1 | 8/2007 | Ogura et al. | | WO | WO2006/089641 | 8/2006 |
| 2007/0201715 A1 | 8/2007 | Minervini ............... 381/355 | | WO | WO2007/010361 | 1/2007 |
| 2007/0202627 A1 | 8/2007 | Minervini ............... 438/51 | | WO | WO 2007/022249 | 2/2007 |
| 2007/0217635 A1 | 9/2007 | Ogura et al. | | | | |
| 2007/0222056 A1 | 9/2007 | Bauer et al. | | | | |
| 2008/0038577 A1 | 2/2008 | Kruger et al. | | | | |
| 2008/0048317 A1 | 2/2008 | Krueger et al. | | | | |
| 2008/0247585 A1 | 10/2008 | Leidl et al. | | | | |
| 2009/0001553 A1 | 1/2009 | Pahl et al. | | | | |
| 2009/0071710 A1 | 3/2009 | Stelzl et al. | | | | |
| 2009/0080682 A1* | 3/2009 | Ogura et al. ............... 381/355 | | | | |
| 2009/0104415 A1 | 4/2009 | Schmajew et al. | | | | |
| 2009/0127697 A1 | 5/2009 | Pahl | | | | |
| 2011/0186943 A1 | 8/2011 | Pahl et al. | | | | |
| 2011/0210409 A1 | 9/2011 | Minervini | | | | |

FOREIGN PATENT DOCUMENTS

| | | |
|---|---|---|
| DE | 198 06 818 | 11/1999 |
| DE | 199 61 842 | 7/2001 |
| DE | 101 45 100 | 5/2002 |
| DE | 103 03 263 A1 | 8/2004 |
| DE | 202 005 001 559 | 6/2005 |
| DE | 10 2005 008 512 A1 | 8/2006 |
| EP | 0077615 | 4/1983 |
| EP | 0774888 | 5/1997 |
| EP | 0 742 643 B1 | 2/2002 |
| FR | 2 799 883 | 4/2001 |
| JP | 55-134942 | 10/1980 |
| JP | 57-100754 | 6/1982 |
| JP | 57-207500 | 12/1982 |
| JP | 61-033509 | 12/1982 |
| JP | 58-030394 | 2/1983 |
| JP | 58-203016 | 11/1983 |
| JP | 62-230297 | 10/1987 |
| JP | 03-116899 | 5/1991 |
| JP | 04-281696 | 10/1992 |
| JP | 06-334298 | 12/1994 |
| JP | 7-212180 | 8/1995 |
| JP | 7-212181 | 8/1995 |
| JP | 08-043435 | 2/1996 |
| JP | 10-321666 | 12/1998 |
| JP | 11-508101 | 7/1999 |
| JP | 2001-157298 | 6/2001 |
| JP | 2001-339796 | 12/2001 |
| JP | 2002-134875 | 5/2002 |
| JP | 2003-078981 | 3/2003 |
| JP | 2003-508998 | 3/2003 |
| JP | 2003-304595 | 10/2003 |
| JP | 2004-79776 | 3/2004 |
| JP | 2004-229200 | 8/2004 |
| JP | 2004-537182 | 12/2004 |
| JP | 2005-198051 | 7/2005 |
| JP | 2005-294462 | 10/2005 |
| JP | 2007-60661 | 3/2007 |
| JP | 2007-524514 | 8/2007 |
| JP | 2008-532369 | 8/2008 |
| JP | 2009-501442 | 1/2009 |
| WO | WO97/01258 | 1/1997 |

OTHER PUBLICATIONS

International Search Report and Written Opinion in Application No. PCT/EP05/004309, dated Sep. 13, 2005.
International Search Report and Written Opinion in Appplication No. PCT/DE2006/001736, dated Mar. 12, 2007.
International Preliminary Report on Patentability in Application No. PCT/DE2006/001946, dated Jun. 11, 2008.
International Search Report and Written Opinion in Application No. PCT/DE2006/001945, dated Mar. 28, 2007.
International Preliminary Report on Patentability in Application No. PCT/DE2006/001945, dated Jun. 11, 2008.
International Search Report and Written Opinion in Application No. PCT/EP03/06596, dated Jan. 20, 2004.
Barton et al., "Optimisation of the Coating of a Fiber Optical Sensor Embedded in a Corss-ply GFRP Laminate" Composites: Part A 33 (2002) pp. 27-34.
Bergqvist et al., "A Silicon Condenser Microphone Using Bond and Etch-Back Technology", Sensors and Actuators A, vol. 45, pp. 115-124 (1994).
Oda et al., "New Nanostructured Film Making Method Using Ultra Fine Particles"; pp. 21-26.
International Search Report from corresponding PCT Application No. PCT/DE2006/001946, mailed Feb. 22, 2007, 5 pages.
English translation of Written Opinion for PCT/DE2006/001946.
Arnold, David P., "A MEMS-Based Directional Acoustic Array for Aeroacoustic Measurements", Master's Thesis, Univ. of Florida (2001).
Gilleo, Ken, ed., Excerpt from Area Array Packaging Handbook, (2002).
Hannenmann et al., eds., Semiconductor Packaging: A Multidisciplinary Approach (1994).
Lau, John H., Ed., Ball Grid Array Technology, McGraw Hill, Inc., ISBN 0-07-036608-X, (Pub. 1995).
U.S. Appl. No. 09/886,651, filed Jun. 21, 2001, Minervini.
U.S. Appl. No. 09/886,854, filed Jun. 21, 2001, Minervini.
U.S. Appl. No. 10/921,747, filed Aug. 19, 2004, Minervini.
U.S. Appl. No. 11/112,043, filed Apr. 22, 2005, Minervini.
U.S. Appl. No. 11/276,025, filed Feb. 10, 2006, Minervini.
U.S. Appl. No. 11/538,056, filed Oct. 3, 2006, Minervini.
U.S. Appl. No. 11/741,881, filed Apr. 30, 2007, Minervini.
U.S. Appl. No. 11/741,884, filed Apr. 30, 2007, Minervini.
U.S. Appl. No. 60/253,543, filed Nov. 28, 2000, Minervini.
U.S. Appl. No. 90/009,739, filed May 5, 2010, Minervini.
U.S. Appl. No. 90/009,740, filed May 5, 2010, Minervini.
U.S. Appl. No. 90/010,984, filed Jun. 9, 2010, Minervini.
U.S. Appl. No. 90/010,985, filed May 6, 2010, Minervini.
U.S. Appl. No. 90/011,058, filed Jun. 23, 2010, Minervini.
U.S. Appl. No. 95/000,509, filed Oct. 7, 2009, Minervini.
U.S. Appl. No. 95/000,513, filed Dec. 14, 2009, Minervini.

U.S. Appl. No. 95/000,515, filed Nov. 4, 2009, Minervini.
U.S. Appl. No. 95/001,251, filed Nov. 24, 2009, Minervini.
U.S. Appl. No. 95/001,363, filed Jun. 30, 2010, Minervini.
U.S. Appl. No. 95/001,364, filed Jun. 30, 2010, Minervini.
U.S. Appl. No. 95/001,365, filed Jun. 30, 2010, Minervini.
"Acoustic Applications of Pressure Tranducers," National Semiconductor Corp., Pressure Transducer Handboock, pp. 12-1 to 12-5 (1997).
"Configurations, Packaging and Environment," National Semiconductor Corp., Pressure Tranducer Handbook, pp. 4-2 to 4-5 (1977).
"Nano 50 Awards announced," [online] [Retrieved on Jan. 17, 2011]; Retrieved from Foresight Institute the Internet URL: http://www.foresight.org/nanodot/?p=1990; 6 pages.
"Small Times Magazine Best of Small Tech Awards Recognize Micro and Nano Technologies Affecting Today's World," [online] [Retrieved on Jan. 17, 2011]; Retrieved from nano Techwire.com the Internet URL: http://www.nanotechwire.com/news.asp?nid=539; 4 pages.
Arnold et al., "MEMS-based Acoustic Array Technology", 40th AIAA Aerospace Sciences Meeting and Exhibit, (Jan. 2002).
Arnold et al., "A directional acoustic array using a silicon micromachined piezoresistive microphones", J. Acoust. Soc. AM 113(1):289-298 (2003).
Bever et al., "BICOS Compatible Silicon Microphone Packaged as Surface Mount Device", Sensors Expo (1999).
Bouchard et al., "Dynamic Times for MEMS Microphones: MEMS Microphone Market & Supplier Analysis 2006-2013," iSuppli Corporation (2009) 4 pages.
Electronic Materials handbook, p. 483 (Fig. 1), ASM Int'l., (1989).
Gale, Bruce K., "MEMS Packaging," Microsystems Principles pp. 1-8 (Oct. 2001).
Giasolli, Robert, "MEMS Packaging Introduction," pp. 1-11 (Nov. 2000).
Gilleo, "MEMS/MOEMS Packing: Concepts, Designs, Materials, and Processes," MEMS and MOEMS Packing Challenges and Strategies, The McGraw-Hill Companies, Inc., Ch. 3:84-102 (2005) 21 pages.
Harper, Chas. et al., Electronic Packaging, Microelectronics and Interconnection Dictionary, pp. 139, 190-191, (1993).
Harper, Chas., ed., Electronic Packaging and Interconnection Handbook, 3rd Ed., McGraw-Hill, pp. 7.34 to 7.38 (2000).
Henning et al., "Microfluidic MEMS for Semiconductor Processing," IEEE Trans. on Components, Packing and Manufacturing Technology, Pt. B, 21(4):329-337 (1998).
Hsu, "MEMS Packaging: Fundamentals of MEMS packaging," INSPEC, The Institution of Electric Engineers, pp. 17-19 (2004) 5 pages.
JEDEC Standard, "Terms, Definitions, and Letter Symbols for Microelectronic Devices", JEDEC Solid State Technology Association, Electronic Industries Alliance, JESD99B 2007.
Kress et al., "Integrated Silicon Pressure Sensor for Automotive Application with Electronic Trimming," SAE International, SAE Technical Pater Series 950533 (1995) 9 pages.
Luthra, Mukluk, "Process challenges and solutions for embedding Chip-On-Board into mainstream SMT assembly", pp. 426-433, Proc. Of the 4th Int'l. Symposium on Electronic Materials and Packaging (Dec. 2002).
Maluf, "An Introduction to Microelectromechanical Systems Engineering: The Box: Packaging for MEMS," Artech House MEMS library, Ch. 6:201-203 (2000) 5 pages.
O'Neal, Chad et al., Challenges in the Packaging of MEMS, IEEE Int'l Symposium on Advanced Packaging Materials (1999).
Pecht, Michael, ed., Handboock of Electronic Package Design, pp. 1-5, Fig. 1.1 (1991).
Petersen et al., "Silicon Accelerometer Family; Manufactured for Automotive Applications," pp. 214-222 (1992).
Premachandran et al., "Si-based Microphone Testing Methodology and Noise Reduction," Proceedings of SPIE 4019:588-592 (2000).
Ramesham, Rajeshuni et al., "Challenges in Interconnection of Packaging of Microelectromechanical Systems (MEMS)", Electric Components and Technology Conference (2000).
Schweber and Clark, "And the statuette goes to . . . ," [online] [Retrieved on Jan. 17, 2011]; Retrieved from the Internet URL:http//www.edn.com/article/print/470437-And_the_statuette_goes_to_.php; 6 pages.
Torkkeli et al., "Capacitive microphone with low-stress polysilicon membrane and high-stress polysilicon backplate," Sensors and Actuators 85L116-123 (2000).
Torkkeli et al., "Capacitive Silicon Microphone," Physica Scripta T79:275-278 (1999), (Published at least by May 14, 1992).
Tummala et al, "Fundamentals of Microsystems Packaging," The McGraw-Hill Companies, Inc., Ch. 14:560-561 (2001) 4pages.
English translation of Written Opinion for PCT/DE2006/001946, Jul. 9, 2008.
International Preliminary Report on Patentability in Application No. PCT/DE2006/001736, dated Apr. 29, 2008.
International Search Report in Application No. PCT/EP2006/001116, dated Aug. 31, 2006.
International Preliminary Report on Patentability in Application No. PCT/EP2006/001116, dated Sep. 11, 2007 (incl. Written Opinion).
International Search Report and Written Opinion in Application No. PCT/EP2005/008373, dated Nov. 8, 2005.
International Preliminary Report on Patentability and Written Opinion for PCT/EP2006/001120, dated Sep. 11, 2007.
International Search Report in Application No. PCT/EP2006/001120, dated Oct. 26, 2006.
International Search Report in Application No. PCT/EP2006/001121, dated Jul. 7, 2006.
International Preliminary Report on Patentability and Written Opinion for PCT/EP2006/001121, dated Sep. 11, 2007.
Machine Translation of German Publication No. DE10303263A1, published Aug. 2004.
Notification of reasons for Refusal in Japanese Patent Application No. 2007-556514, dated Jul. 13, 2011.
Notification of reasons for Refusal in Japanese Patent Application No. 2007-556515, dated Jun. 23, 2011.
Notification of reasons for Refusal in Japanese Patent Application No. 2007-556516, dated Sep. 22, 2011.
Action and Response History in U.S. Appl. No. 10/523,875.
Action and Response History in U.S. Appl. No. 11/578,854.
Action and Response History in U.S. Appl. No. 11/573,610.
Action and Response History in U.S. Appl. No. 11/816,960.
Action and Response History in U.S. Appl. No. 11/816,964.
Action and Response History in U.S. Appl. No. 11/816,969.
Action and Response History in U.S. Appl. No. 12/090,529.
Action and Response History in U.S. Appl. No. 12/092,439.
Action and Response History in U.S. Appl. No. 13/075,936.
Bay J. et al "Design of a Silicon Microphone with Differential Readout of a Sealed Double Parallel-Plate Capacitor" Int. Conf. Eurosensors, Jun. 25, 1995, pp. 700-703, XP010305041.
Becker, K. et al., "MEMS Packaging—Techological Solutions for a Si-Microphone", Fraunhofer Inst. for Reliability and Micro Integration, Berlin; pp. 405-406, (Mar. 2004).
Gilleo, K. Handbook of flexible circuits, Gilleo, K. (ed), Van Nostrand Reinhold, 1992, pp. 145-166 [Ch. 8—Integrated Features].
Hsieh, W. H. et al "A Micromachined Thin-film Teflon Electret Microphone" Dept. of Electrical Engineering, California Inst. of Technology; vol. 1 P: 282.02 IEEE, 1997.
!mai, Nobuomi, "A New Piezoelectric Microphone with Divided Electrodes and its Applications" J. Acoust. Soc. Jpn. (E) 11,6 (1990) pp. 327-333.
Lukes M. "Silicon Condenser Microphone: Electroacoustic Model and Simulation" Czech Tech. University in Prague, Faculty of Electrical Engineering, Sep. 26, 2001, pp. 57-66.
Neumann J. J. et al "A Fully-integrated CMOS-MEMS Audio Microphone" 12th Intl Conf. on Solid State Sensors, Actuators and Microsystems, Boston, Jun. 8-12, 2003, pp. 230-233.
Niu M-n. et al "Piezoeclectric Bimorph Microphone Built on Micromachined Parylene Diaphragm" J. of Microelectrochemical Systems, vol. 12, No. 6, Dec. 2003; pp. 892-898, XP001200226, ISSN 1057-7157.
Van der Donk et al "Amplitude-modulated Electromechanical Feedback System for Silicon Condenser Microphones" J. Micromech. Microeng. 2 (1992) 211-214, XP020069302.

van Heeren, et al., "Overview of MEMS Process Technologies for high Volume Electronics", 17 pgs. (Pub. Date: 2005 or later).
Wikipedia, "Flip Chip", [online] Retrieved from the Internet: <URL: http://en.wikipedia.org/wiki/Flip_chip>, [retrieved on Nov. 15, 2011].
Notification of Reasons for Refusal (english translation) in Japanese Patent Application No. 2008-539238, dated Nov. 11, 2011.
Japanese Patent Office, Translation of the Notification of Reasons for Refusal (type I office action) in JP Patent Application No. 2008-539239, mailed Sep. 22, 2011, 6 pages.
Hayes et al., "Micro-jet printing of polymers for electronics manufacturing" IEEE; pp. 168-173, XP 002342861 (1998).
Hayes et al., "Printing systems for MEMS packaging" vol. 4558, 2001, pp. 206-214, XP 002342860.

Oda et al., "New Nanostructured Film Making Method Using Ultra Fine Particles"; pp. 21-26, Apr. 21, 2004.
Selmeier et al., "Recent Advances in Saw Packaging", IEEE Ultrasonics Symposium; 2001; pp. 283-292.
Torkkeli et al., "Capacitive Silicon Microphone", Physica Scripta., vol. T79, pp. 275-278 (1999).
English translation of Written Opinion for PCT/DE2006/001946, Feb. 2, 2007.
Zhao Y. et al "MEMS-Based Piezoelectric Microphone for Biomedical Applications" MEMES Sensors and Actuators Lab (MSAL), Dept. of Electrical and Computer Engineering, The Inst. For Systems Research, U. of Maryland, Nov. 16, 2001.

* cited by examiner

MEMS MICROPHONE, PRODUCTION METHOD AND METHOD FOR INSTALLING

CROSS REFERENCE TO RELATED APPLICATIONS

Pursuant to 35 USC §120, this application claims the benefit of PCT/DE2006/001946 filed Nov. 6, 2006 which claims the benefit of German Patent Application No. 102005053767.7 filed Nov. 10, 2005. Each of these applications is incorporated by reference in its entirety.

BACKGROUND

There is great demand to miniaturize the electronic components of mobile communications devices. This especially applies also, e.g., to microphones, because they have a relatively high-profile design and thus represent limitations for the device design of mobile communications devices.

From the published American Patent Application No. US 2005/0185812A1, a microphone housing is known, in which a microphone constructed as a MEMS component is arranged together with a semiconductor chip on a base plate and is covered with a common cap against the base plate. The base plate can have, on its bottom side opposite the cap, a sound entrance opening, so that the entire component can be soldered onto the back side of the printed-circuit board, which is turned away from the sound source. For this purpose, a corresponding borehole must be provided in the printed-circuit board. In another construction, the sound entrance opening can be provided in a conventional way on the top side in the cap, so that the component with the base plate can be deposited onto the surface of the printed-circuit board facing the sound source.

SUMMARY

The problem of the present invention is to specify another design for miniaturized microphones, with which the total structural height of a printed-circuit board equipped with a microphone can be reduced.

A disadvantage of the known microphone described above is that the total height of the component cannot be further reduced, because the height of the MEMS chip essentially determines the total height of the component. In order to solve this problem, a microphone is currently proposed, with which the thickness of the printed-circuit board can be used for holding the height-determining MEMS chip. For this purpose, for a flat carrier substrate, which has a recess reaching through the carrier substrate, an electro-acoustic transducer at least partially covering the recess is arranged on a first surface. On the second surface opposite the first surface sits a cap, which sits directly on the carrier substrate covering the recess and which forms a tight seal with its surface and which spans the recess. The cap has at least one metallic layer for the electromagnetic shielding of the electro-acoustic transducer.

This microphone is suitable for mounting on the back side of the printed-circuit board facing away from the sound source, wherein a borehole in the printed-circuit board can hold the electro-acoustic transducer. Therefore, for the conventional thicknesses of printed-circuit boards used today of ca. 0.5 to 1.2 millimeters, it is possible that the electro-acoustic transducer, which is constructed, in particular, as a MEMS component, is embedded completely in the borehole of the printed-circuit board. Therefore, the total height of the microphone measured above the surface of the printed-circuit board after installation is only determined by the height of the cap plus the thickness of the carrier substrate. This can lie in the range of a few tenths of a millimeter.

The electro-acoustic transducer is preferably a MEMS component built on a silicon wafer. For the electro-acoustic conversion, all of the known principles are suitable, capacitive transducers in particular, and those operating especially on the piezoelectric principle. Such components are known and distinguish themselves through the common property that the acoustic energy of the sound wave sets a membrane or another moving part in oscillation; the oscillations are converted by means of a suitable transducer principle into electrical signals.

The carrier substrate can be equipped with additional active and/or passive electrical components, which can directly interact with the microphone function and are directly connected to the microphone. Such components can be, in particular, impedance transducers or amplifiers, low-pass filters, signal processors, analog/digital converters, or ESD protective components against electrostatic overcharging. Advantageously, these additional electrical components are arranged on the surface of the carrier substrate lying opposite the electrical transducer and, in particular, under the cap. In addition, the cap spans a hollow space, which is formed between the cap and the carrier substrate and which can be used as a rear volume and thus as a reference for the electro-acoustic transducer.

The cap can be made completely from metal and soldered or bonded onto the carrier substrate. Alternatively, it can also be made from a non-metallic material, which is coated with a metallic layer. Preferably, but not absolutely necessary, the metallic coating is formed on the outer side of the cap. As a non-metallic carrier material, the cap can comprise a plastic layer; for example, a plastic film, which is coated onto one side with a metallic layer.

The carrier substrate preferably has at least one metallization layer, which can be structured to form corresponding electrical connection surfaces and electrical connection lines. Contacts connected to the electro-acoustic transducer and preferably also to the other electrical component are arranged at least on the first surface carrying the electro-acoustic transducer.

The electrical connection to the component arranged on the second surface under the cap can be realized via lines integrated into the carrier substrate and, in particular, by means of via contacts. However, it is also possible that the electro-acoustic transducer built preferably on the silicon wafer has corresponding terminals, which are connected via a wire contact to the connection surfaces on the first surface of the carrier substrate. The component can then also be connected through the recess in the carrier substrate by means of bonding wires to the electro-acoustic transducer. The component can also be connected, however, via bonding wires to corresponding connection surfaces on the second surface of the carrier substrate, which are connected by means of via contacts through the carrier substrate to the corresponding contacts on the first surface of the carrier substrate. However, it is also possible to connect the component directly to the corresponding contacts on the second surface, for example, in a flip-chip arrangement. The electrical connection can be realized by means of conductive adhesive or by means of a solder connection. Likewise, the electro-acoustic transducer can be affixed and wire-bonded or soldered onto corresponding contact surfaces or affixed by means of conductive adhesive.

The carrier substrate can also have multiple layers and can have at least one other metallization layer in its interior. Wiring or circuitry can be realized in this layer. However, through suitable structuring of the metallization layer it is also possible to realize passive components in one or more metallization layers; for example, capacitors, inductors, or resistors. Accordingly, these passive electrical components can be connected to circuitry, with which other electrical functions of the microphone or components interacting with this microphone are realized. Individual metallization layers can be connected by via contacts. In a carrier substrate made from organic laminates, active semiconductor components—Ics—can also be embedded.

For conversion, the electro-acoustic transducer can have at least one piezoelectric layer provided with transducer electrodes. The transducer electrodes can be constructed in such a way that they can convert bulk acoustic waves generated in the piezoelectric layer by the acoustic energy into electrical signals. Preferably, the transducer electrodes are then arranged on both sides of the piezoelectric layer. However, a one-sided arrangement of transducer electrodes spaced apart from each other for transforming bulk waves and also a suitably constructed transducer for transforming surface acoustic waves or shear waves is also possible.

The cap sitting on the second surface represents electromagnetic rear-side shielding for the microphone. It is also advantageous to provide the surface of the electro-acoustic transducer pointing toward the sound source with electromagnetic shielding. For on the first surface of the carrier substrate and on parts of the electro-acoustic transducer. The shielding layer on the electro-acoustic transducer can be deposited on all of the electro-acoustic transducer not for the membrane or on the part of the electro-acoustic transducer receiving the oscillation.

Alternatively, it is also naturally possible to provide this shielding on the surface of the printed-circuit board facing the sound source. In this case, it is even possible to cover the opening of the printed-circuit board borehole directed toward the sound source with an especially mesh-like shielding that is permeable to sound waves, for example, with a metallic or metal-coated mesh or a metallic or metal-coated perforated film or a metal-coated porous membrane or plate.

Additional electro-acoustic shielding can be provided in the interior of the printed-circuit board. For example, the inside of the borehole for the electro-acoustic transducer in the printed-circuit board can be coated with conductive material. It is also possible to provide a series of metallic structures within the printed-circuit board; for example, a crown of via contacts, at a distance from the borehole but surrounding it.

Preferably, all of the metallization layers provided for electromagnetic shielding are connected to ground potential in order to safely drain away dangerous voltages and charges generated electrostatically or in some other way, and in this way to protect the component and/or to prevent electromagnetic interference in the measured signal.

Below, the microphone and also the method for fabricating the microphone will be explained in more detail with reference to embodiments and the associated figures. The figures are shown purely schematically and not true to scale, so that neither absolute nor relative dimensional information can be taken from these figures.

DESCRIPTION OF THE DRAWINGS

Shown in detail are.

DETAILED DESCRIPTION

Figure 1:
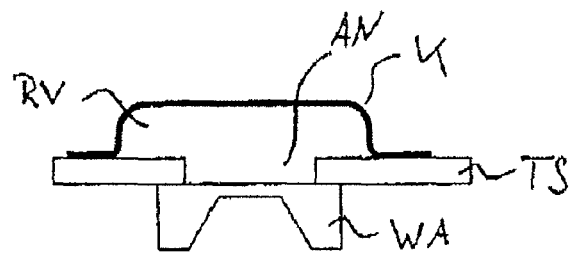
FIG. 1, a microphone with a metallic cap.

FIG. 1 shows a simple microphone according to the invention in schematic cross section. The system is formed on a carrier substrate TS, which is built from an organic or ceramic material and in particular, from a laminate with at least one metallization layer, but preferably with several metallization layers embedded between electrically insulating material layers. In these structured metallization layers, active and passive components can be realized, which is advantageous, in particular, for ceramic laminates made from HTCC or LTCC. Glass or silicon is also suitable for the carrier substrate TS. Preferred thicknesses lie between 0.1 and 0.5 millimeters. Larger layer thicknesses are naturally possible, but increase the costs and oppose further miniaturization of the components or the microphone.

In the carrier substrate, a recess AN is provided. On the first surface, an electro-acoustic transducer WA is arranged so that it completely covers the recess. The electro-acoustic transducer WA is, in particular, a MEMS component (micro-electromechanical system), which is a sensor that is produced with micro-mechanical methods preferably on a single-crystal material, such as, for example, silicon, and that works according to a capacitive or piezoelectric principle. In a crystalline substrate material, through anisotropic etching of the substrate, the transducer can have an opening that tapers inwardly and on whose base a membrane or a correspondingly shaped tongue is arranged, which is set to oscillate by the acoustic energy. On the second surface sits a cap K, which similarly covers the recess and which can form a good seal all around and in particular, hermetically with the surface of the carrier substrate TS. However, selective leaks for slow pressure equalization with the ambient pressure can also be provided. In this way, a closed rear-side volume RV is created, which is used as a reference by the electro-acoustic transducer.

The cap can have a round, polygonal, or a different, arbitrarily shaped cross section and comprises at least one metal layer or is made completely from metal.

Figure 2:
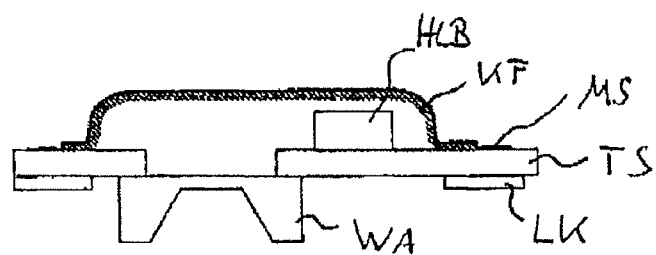
FIG. 2, a microphone with a metal-coated cap and an electrical component.

FIG. 2 shows another implementation of a microphone in which a semiconductor component HLB is also arranged under the cap on the second surface of the carrier substrate TS. In addition, here one possible modification of the cap K is shown, which is made from a plastic film KF, in particular, a laminate film and a metal layer MS deposited above this film. Preferably, the plastic film KF is structured in such a way that the larger surface area metal layer MS completely covers the plastic film and the plastic film KF forms an all-around, flush seal with the surface of the carrier substrate TS. However, the metal layer is connected at one or more points to ground potential, which contacts the carrier substrate at metallization structures located there.

In addition, in FIG. 2 on the first surface of the carrier substrate, solderable contacts LK are shown, which are connected in a suitable way both to the electro-acoustic transducer WA and to the semiconductor component HLB. The connection can be realized by means of printed conductors, which are formed on the surface. Connections leading through the carrier substrate are also possible.

Not shown are additional implementations in which several, optionally also different semiconductor components or passive components, are arranged on the second surface underneath the cap K and are connected to the electro-acoustic transducer WA. In an especially preferred way, the semiconductor component or components, together with the electro-acoustic transducer WA, which is then formed, for example, as a resonator on the basis of a surface wave component or as a BAW resonator, form an oscillator circuit. Furthermore, in the carrier substrate or in the form of a component on the second surface of the carrier substrate, measures can be realized that are used for temperature compensation of the electro-acoustic transducer and whose temperature changes are compensated through active control or passively through suitable compensation means.

Figure 3:
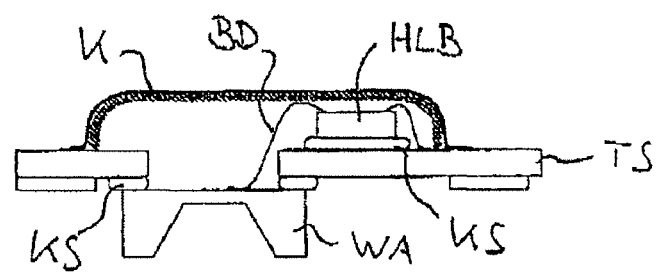
FIG. 3, a microphone with another electrical component, which is connected by means of bonding wires, FIG. 4, a component mounted on a printed-circuit board, FIG. 5, a component mounted on a printed-circuit board with additional shielding above the electro-acoustic transducer, FIG. 6, processing steps of a method for fabricating an encapsulated microphone, FIG. 7, processing steps of a method for generating additional shielding on the electro-acoustic transducer, and FIG. 8, a microphone with two electro-acoustic transducers on a common carrier substrate.

FIG. 3 shows another implementation of the microphone, in which both the semiconductor component HLB and also the electro-acoustic transducer WA, or at least one of these two, is mounted on the carrier substrate TS by means of an adhesive layer KS. The electrical connection can be realized as shown, for example, by means of bonding wires BD, wherein a bonding wire guided through the recess AN in the carrier substrate TS can electrically interconnect the semiconductor component HLB and electro-acoustic transducer. However, it is also possible to realize at least one of the electrical connections to a metallization layer formed on the surface of the carrier substrate TS by means of an electrically conductive adhesive layer KS. In this case, especially preferred are anisotropic conductive adhesives, which exhibit conductivity exclusively in the Z-direction, that is, perpendicular to the surface of the carrier substrate.

Figure 4:
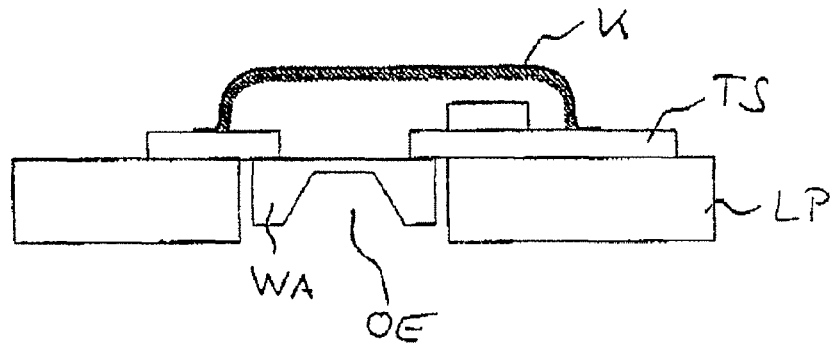

In the schematic cross section, FIG. 4 shows how a microphone can be mounted on a printed-circuit board LP in a way that reduces the total overall height. For this purpose, an opening OE is provided in the printed-circuit board LP, a single-layer or multi-layer plate with one or more metallization layers, which is large enough to hold the electro-acoustic transducer WA. The carrier substrate is then placed and fixed with the first surface on the printed-circuit board in such a way that the electro-acoustic transducer WA extends into the opening OE. At conventional thicknesses of the printed-circuit board and electro-acoustic transducer, it is possible to conceal the transducer WA completely in the opening OE, so that it does not project beyond the opposing surface of the printed-circuit board. The electrical connection between the contacts of the carrier substrate and the printed-circuit board can be realized, in turn, by electrically conductive adhesive or by soldering. With the arrangement shown only schematically in the figure, a microphone is obtained, which is electromagnetically shielded by the second surface against external fields and therefore can be operated without interference from these fields.

Figure 5:
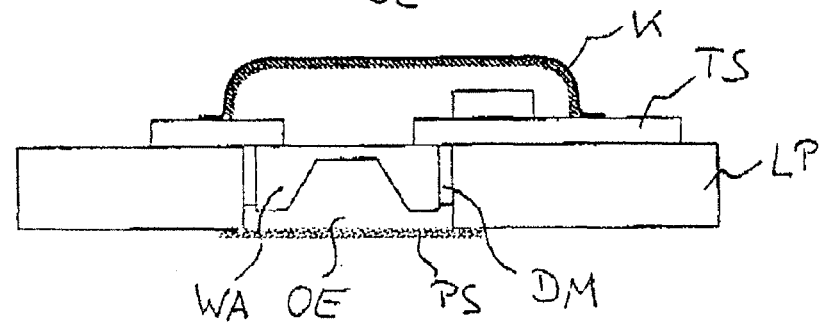

FIG. 5 shows additional implementations of the microphone according to the installation in a printed-circuit board LP, with which a more reliable operation and additional shielding of the component from the opposite side is enabled. For this purpose, for example, the intermediate space between the transducer WA and inner side of the opening OE can be filled with a sealing material DM, for example, with a hardened reactive resin. On the side of the printed-circuit board LP opposite the carrier substrate TS, the opening OE can be covered with a porous layer, a mesh, or netting, which are each metallized on the surface or made completely from a metallic material. Not shown in the figure are additional metallization layers, which are deposited on the same surface as the porous layer PS on the surface of the printed-circuit board LP. Preferably, all of the shielding layers are grounded.

Alternatively or additionally, the electro-acoustic transducer WA can be provided on its surface pointing downward in FIG. 5 with another shielding layer AS (see FIG. 7). In addition, the inner walls of the opening OE can also be metallized. Furthermore, it is possible to provide a shielding lattice made from via contacts surrounding the opening within the printed-circuit board around the opening.

With reference to schematic cross sections, FIG. 6 shows different possible processing steps according to one variant for fabricating a microphone. Here, the starting point is the already described carrier substrate TS. This can be a single-layer or multi-layer construction and has at least one metallization layer, which comprises printed conductors and circuitry formed therefrom. On a first surface (shown at the bottom in the figure), solderable contacts LK are generated, which are connected to corresponding printed conductors on the surface of the carrier substrate TS. On the opposite second surface, a semiconductor component HLB is arranged and preferably also contacted to printed conductors. This can be realized as already described by means of a flip-chip contact or a bonding wire (not shown in the figure). Advantageously, the flip-chip contact can be produced with an anisotropic conductive adhesive, which exhibits conductivity only in the vertical direction relative to the adhesive layer. Thus, with a single adhesive layer, several electrical connections can be produced in parallel, without short-circuiting through the adhesive layer. FIG. 6a shows the arrangement at this processing step.

In the next step, on the second surface, a reactive layer OS is deposited above the semiconductor component. This reactive layer is made from a suitable material that can again be dissolved with a mild process, for example, a paste or an organic material and, in particular, from a resist film. The reactive layer OS can be structured directly, for example, in a printing method, for which pastes or corresponding viscous synthetic resins are suitable. However, it is also possible to apply the reactive layer over a large surface area and only then to structure it.

Figure 6A:
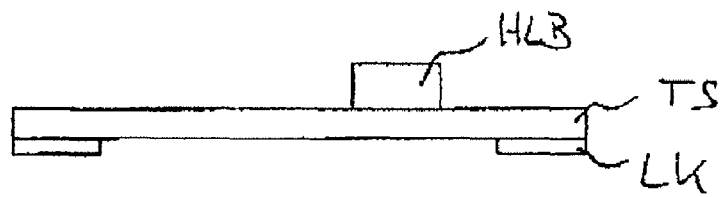
Figure 6B:
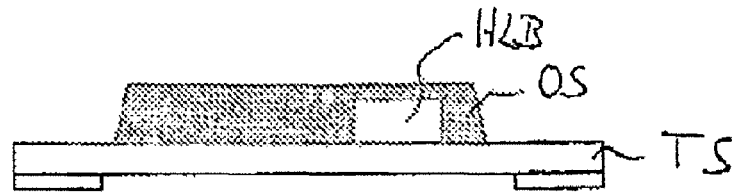
Figure 6C:
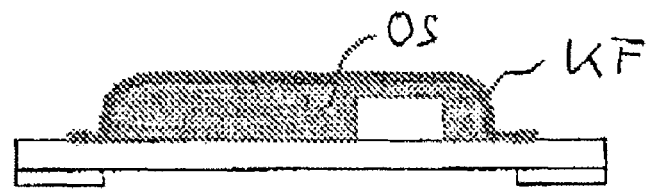

If a photoresist and in particular, a dry resist film that can be laminated, for example, is used for the reactive layer OS, then the structuring can be realized in a simple way photolithographically through exposure and development of the photoresist. The structuring takes place so that the volume of the reactive layer corresponds to the later rear volume enclosed by the covering cap. FIG. 6b shows the arrangement on this processing step.

In the next step, a first layer of a multi-layer cap is generated, for example, a plastic film KF. Preferably, this is deposited in a plastically deformable state, e.g., through lamination or film casting, and then hardened. The lamination can be supported by increased temperature and also mechanical pressure from the top side or a vacuum from the bottom side. The plastic film can have, for example, a thickness of approximately 20 μm. Films of such small thickness are easy to process and generate a dense surface, which can later be metallized. Higher layer densities are naturally also possible, but not necessary.

Figure 6D:
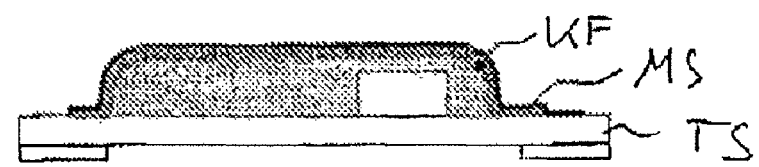

In the next step, according to FIG. 6d, a metal layer MS is generated above the plastic film KF. This is realized preferably in a two-step process, wherein at least one base metallization layer or a suitable adhesive layer is sputtered and then reinforced. As the base or adhesive layer, in particular, one or more of the metals titanium, nickel, chromium, tungsten, and copper are suitable. The reinforcement is realized preferably in a galvanic or current-less method by means of copper or nickel. A gold or nickel layer can also be provided as a coating layer. In one variant of the method, the plastic film can also be eliminated if the reactive layer OS can be metallized, so that the metal layer can be deposited directly on the reactive layer.

A suitable end thickness, which is suitable as good shielding for the microphone, lies between 10 and 100 μm. Higher layer thicknesses are naturally also possible, but are not absolutely necessary for the desired purpose of the shielding.

The metal layer is formed so that it seals the second carrier substrate TS. In this way, a hermetic shield to the carrier substrate can be formed, if necessary. The structuring of the metal layer can be realized after the generation of the base or adhesive metallization layer. It is also possible to deposit a lift-off layer under the metallization layer and to remove it again together with the metal layer lying above this lift-off layer after the metallization or the fabrication of the metal layer MS in a lift-off process.

Figure 6E:
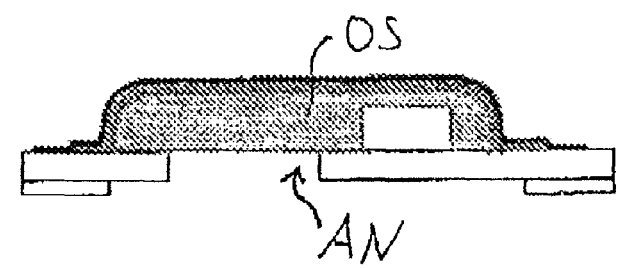

The cap generated in this way and made from the plastic film and metal layer lies on all sides on the structured reactive layer OS, which is now removed. For this purpose, in this processing step a recess AN can be generated in the carrier substrate TS, through which the reactive layer is accessible from the first surface. FIG. 6e shows the arrangement after the fabrication of the recess.

However, it is also possible to generate the recess in an earlier processing stage, for example, before depositing the semiconductor component HLB and in each case before depositing the reactive layer OS. This becomes possible if the reactive layer can span the recess, which is possible, in particular, for a dry resist film as a reactive layer.

The recess can be generated according to the material of the carrier substrate through boring, milling, etching, laser beams, sandblasting, punching, or also ultrasonic erosion. The removal of the reactive layer through the recess can take place preferably with a solvent, for example, an organic solvent for an organic reactive layer or an aqueous solvent for a paste. The breaking up of the reactive layer can also be supported with ultrasonic energy.

Finally, the electro-acoustic transducer is deposited on the first surface above the recess and electrically connected to the printed conductors on the carrier substrate. The electrical connection can be realized with conductive adhesive and, in particular, with anisotropic conductive adhesive. Other flip-chip methods are also possible by means of bump technology, in this case, any gaps at the contacts between the transducer and the carrier substrate are then sealed with a suitable material, in particular with an underfiller. The electro-acoustic transducer is preferably deposited on the carrier substrate with the side carrying the thin-layer construction with the MEMS structures. However, it is also possible to deposit the transducer with the carrier side, in particular, with the silicon chip on the carrier substrate, as long as via contacts are available.

Figure 6F:
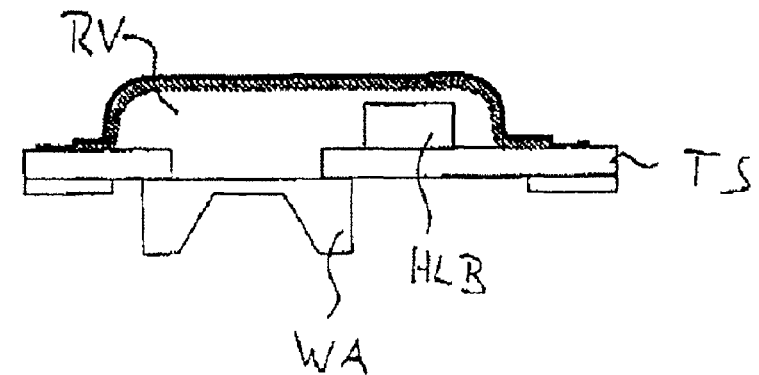

FIG. 6f shows the finished microphone, in which a rear-side volume RV, which is used as reference pressure for the electro-acoustic transducer, is enclosed between the cap, the carrier substrate, and the electro-acoustic transducer WA sealing the recess.

FIG. 7 shows one possibility of metallizing a plurality of electro-acoustic transducers on a panel, and in this way of protecting the sound entrance opening and especially the membrane of the transducer in a simple way or to eliminate the metallization. For this purpose, a corresponding number of electro-acoustic transducers WA are advantageously mounted on a carrier substrate or on an auxiliary carrier, as shown, for example, in FIG. 7a.

Figure 7A:
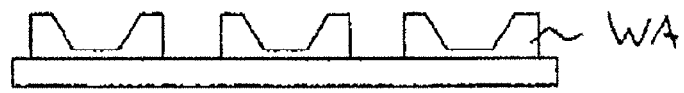
Figure 7B:
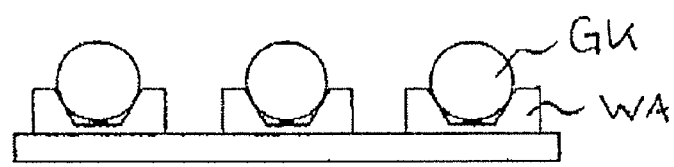
Figure 7C:
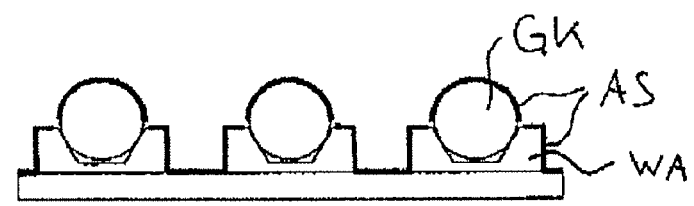

Then small spheres of matching diameter are placed in the only schematically shown openings of the transducer leading to the membrane. The diameter is designed so that it can generate sufficient shading on the electro-acoustic transducer. Suitable sphere diameters can lie, for example, between 0.5 and two millimeters, wherein the spheres are preferably glass spheres. In a simple way, these can also be shaken into the rear-side opening of the electro-acoustic transducer. Since they are not fixed in the transducer opening, excess spheres can be easily removed. FIG. 7b shows the transducer with the glass spheres GK arranged in its openings.

In the next step, a metallization layer is deposited in the form of a shielding layer AS that is preferably anisotropic and vertical to the surface in a desired layer thickness. The cover layer AS can be deposited through sputtering or vaporization.

If the shielding layer AS is deposited directly onto the finished microphones, still interconnected on the panel above the carrier substrate TS, then it may be necessary to protect and, for example, to cover in advance electrical connections before the large surface-area deposited shielding layer. Here, for the metallization layer, a template can be used, which is placed on the carrier substrate.

Figure 7D:
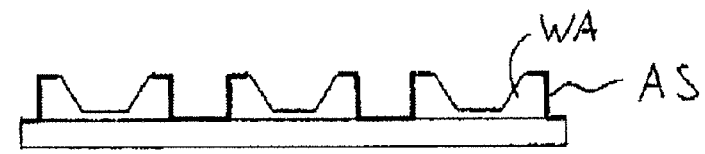

If the shielding layer is deposited in a sufficiently anisotropic process, regions underneath the equator of the sphere remain free of the shielding layer, so that no connection is produced between the shielding layer on the sphere surface and the layer on the surface of the electro-acoustic transducer. Therefore, the spheres can be easily removed after the shielding layer is generated. FIG. 7d shows the arrangement with the electro-acoustic transducers metallized at the desired positions.

Figure 8:
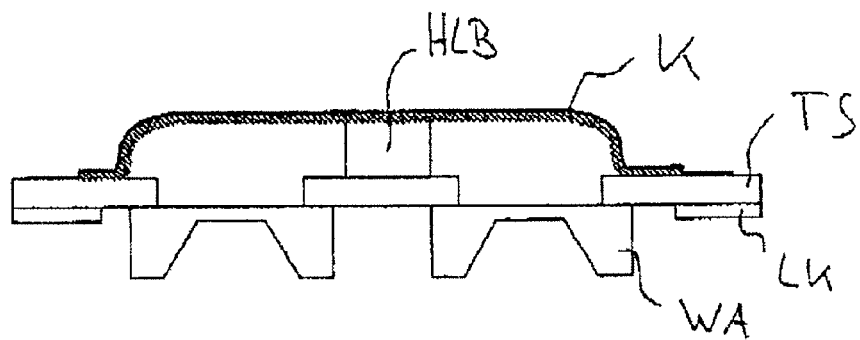

In FIG. 8 another construction of a microphone is shown, which has two or more electro-acoustic transducers in one component. These are each generated above a separate recess in the carrier plate. The recesses can be covered on the second surface with a common cap K. Here it is advantageous to divide the rear-side volume RV, so that for each transducer WA a separate rear-side volume is available. The partitioning can also be realized with the semiconductor component HLB as shown in FIG. 8. For this purpose, the reactive layer OS is structured in such a way that it does not project beyond the top edge of the semiconductor component. For the use of several transducers, it can also be necessary to provide several semiconductor components, of which only one is shown in FIG. 8 for the sake of clarity. However, it is also possible to provide a microphone with a plurality of transducers, wherein a separate cap, which creates a separate rear-side volume above the recess, is deposited on the second surface of the carrier substrate in the region of each individual transducer WA.

The invention is not limited to the shown embodiments and permits a series of possible modifications, which cannot be described here in detail. The same applies to the production method, for which only advantageous implementations were proposed. Thus, in particular, the sequence of individual processing steps usually can be arbitrarily replaced, as long as they are not mutually dependent.

The invention claimed is:

1. A microphone in a miniaturized form, comprising:
    a flat carrier substrate having a first recess extending through the carrier substrate,
    a first electro-acoustic transducer on a first surface of the carrier substrate and at least partially overlapping the first recess, and
    a cap on a second surface opposite the first surface, the cap being configured to form a tight seal with the second surface and span the first recess, the cap comprising at least one metallic layer for electromagnetic shielding.

2. The microphone of claim 1, wherein the first electro-acoustic transducer comprises a micro-electromechanical system (MEMS) component on a silicon wafer.

3. The microphone of claim 1, wherein the cap comprises a multi-layer structure, wherein an outmost layer of the multi-layer structure comprises the metallic layer.

4. The microphone of claim 3, wherein an innermost layer of the cap comprises a plastic film.

5. The microphone of claim 1, further comprising solderable contacts electrically connected to one or more terminals of the first electro-acoustic transducer and/or one or more integrated components on the first surface of the carrier substrate.

6. The microphone of claim 1, further comprising at least one electrical component electrically connected to the first electro-acoustic transducer and selected from the group consisting of an impedance transducer, amplifier, low-pass filter, signal processor, A/D converter, and fuse component, the at least one electrical component being on the second surface of the carrier substrate under the cap.

7. The microphone of claim 1, wherein the carrier substrate comprises at least one metallization layer including electrical connection lines.

8. The microphone of claim 7, wherein the carrier substrate is comprises a multi-layered structure that includes at least one additional metallization layer, wherein the metallization layers are separated by one or more electrically insulating layers and connections between the metallization layers by via contacts form circuitry.

9. The microphone of claim 1, wherein the first electro-acoustic transducer includes at least one piezoelectric layer comprising transducer electrodes for electrically converting sound signals.

10. The microphone of claim 1, further comprising a shielding layer comprising metal on the first surface of the carrier substrate and on parts of the first electro-acoustic transducer.

11. The microphone of claim 1, wherein further comprising a second electro-acoustic transducer above a second recess on the first surface of the carrier substrate.

12. The microphone of claim 11, wherein each of the first and the second electro-acoustic transducers has a body comprising crystalline silicon and having on its surface away from the first surface of the carrier substrate, a sound entrance opening closed with a porous, metallized membrane.

* * * * *

UNITED STATES PATENT AND TRADEMARK OFFICE
CERTIFICATE OF CORRECTION

Page 1 of 1

PATENT NO. : 8,229,139 B2
APPLICATION NO. : 12/092423
DATED : July 24, 2012
INVENTOR(S) : Wolfgang Pahl It is certified that error appears in the above-identified patent and that said Letters Patent is hereby corrected as shown below:

Column 10, Line 15, In Claim 11, delete "wherein further" and insert -- further --

Signed and Sealed this
Eighteenth Day of September, 2012

David J. Kappos
*Director of the United States Patent and Trademark Office*